(12) United States Patent
Yang et al.

(10) Patent No.: US 11,794,289 B2
(45) Date of Patent: Oct. 24, 2023

(54) SUCTION UNIT, TRANSFER MECHANISM, LOADING DEVICE, AND METHOD FOR LAYING SOLAR CELL STRING

(71) Applicant: SUZHOU XIAONIU AUTOMATION EQUIPMENT CO., LTD., Suzhou (CN)

(72) Inventors: Yong Yang, Suzhou (CN); Yonggang Wu, Suzhou (CN); Biao Yin, Suzhou (CN); Qifei Ge, Suzhou (CN); Xiangxiang Ma, Suzhou (CN)

(73) Assignee: SUZHOU XIAONIU AUTOMATION EQUIPMENT CO., LTD., Suzhou (CN)

( * ) Notice: Subject to any disclaimer, the term of this patent is extended or adjusted under 35 U.S.C. 154(b) by 0 days.

(21) Appl. No.: 18/313,483

(22) Filed: May 8, 2023

(65) Prior Publication Data

US 2023/0271279 A1 Aug. 31, 2023

(30) Foreign Application Priority Data

Sep. 15, 2022 (CN) .......................... 202211119195.2

(51) Int. Cl.
*B23K 37/00* (2006.01)
*B23K 37/04* (2006.01)
*B65G 47/91* (2006.01)
*H01L 31/18* (2006.01)
*B23K 101/40* (2006.01)

(52) U.S. Cl.
CPC .......... *B23K 37/0426* (2013.01); *B65G 47/91* (2013.01); *H01L 31/188* (2013.01); *B23K 2101/40* (2018.08)

(58) Field of Classification Search
CPC ...... B23K 2101/40; B23K 37/04–0461; B65G 47/91; H01L 31/188; H01L 21/67742; H01L 21/67754; H01L 21/6776; H01L 21/6838; H01L 31/048; Y02P 70/50
USPC .................... 228/43, 47.1, 49.1, 49.4, 49.5
See application file for complete search history.

(56) References Cited

U.S. PATENT DOCUMENTS

2020/0266317 A1* 8/2020 Bosman .............. H01L 31/0463

FOREIGN PATENT DOCUMENTS

| CN | 102085597 A | * | 6/2011 |
| CN | 108518957 A | * | 9/2018 |
| CN | 208111584 U | * | 11/2018 |
| CN | 209912982 U | * | 1/2020 |
| CN | 110977224 A | | 4/2020 |
| CN | 111185687 A | | 5/2020 |
| CN | 111192939 A | | 5/2020 |
| CN | 111697105 A | | 9/2020 |
| CN | 214542159 U | | 10/2021 |
| CN | 113602807 A | * | 11/2021 |
| CN | 217452655 U | * | 9/2022 |

(Continued)

*Primary Examiner* — Kiley S Stoner

(57) ABSTRACT

A suction unit, including a first module, a second module, and a third module. The first module is provided with an air-permeable zone. The second module is provided with air holes a. The third module is provided with air holes b. A solder ribbon and a solar cell are sequentially stacked on the first module. A channel S2 is formed by the air holes b and the air holes a to fix the first module to the second module. A channel Si is formed by the air holes b, the air holes a and the air-permeable zone to fix the solder ribbon and the solar cell on the first module.

13 Claims, 7 Drawing Sheets

(56) References Cited

FOREIGN PATENT DOCUMENTS

| | | | | |
|---|---|---|---|---|
| CN | 217485529 | U | * | 9/2022 |
| CN | 115207165 | A | * | 10/2022 |
| CN | 115783624 | A | * | 3/2023 |
| JP | 2010010649 | A | | 1/2010 |
| KR | 20150136166 | A | * | 12/2015 |

* cited by examiner

SUCTION UNIT, TRANSFER MECHANISM, LOADING DEVICE, AND METHOD FOR LAYING SOLAR CELL STRING

CROSS-REFERENCE TO RELATED APPLICATIONS

This application claims the benefit of priority from Chinese Patent Application No. 202211119195.2, filed on Sep. 15, 2022. The content of the aforementioned application, including any intervening amendments thereto, is incorporated herein by reference in its entirety.

TECHNICAL FIELD

This application relates to solar cells, and more particularly to a suction unit, a transfer mechanism, a loading device, and a method for laying a solar cell string.

BACKGROUND

Generally, the solar cell string is produced by high-temperature soldering between solar cells and the solder ribbon. However, this operation has a high requirement for positioning accuracy of the solder ribbon, and is costly due to the silver paste printed on the grid line of the solar cells. Therefore, a modified cell string manufacture method has emerged. In this method, the solder ribbon is pre-bonded to the solar cells with an adhesive film, and then the thermal lamination is performed to enable the soldering of the solder ribbon with the solar cells.

In the existing technologies, the solder ribbon needs to be bonded with the adhesive film before being bonded to the solar cells, and then the solar cells are connected in series to form the solar cell string. The complicated bonding and layout process significantly reduce the manufacture efficiency. Besides, during the transportation of the cell string, it is often required to compress the solar cells and the adhesive film onto a conveyor belt by using a compression mechanism to enable the fixing, and in this case, the solar cells are prone to hidden cracking and breaking. Thus, there is an urgent need to develop an efficient and stable cell string transfer device and method to solve the above problems.

SUMMARY

An object of the present disclosure is to provide a suction unit, a transfer mechanism, a loading device, and a method for laying a solar cell string to overcome the aforementioned deficiencies. In this application, the solder ribbon is bonded to the solar cell with a film, and the cell is positioned and absorbed on the conveyor belt through the conveyor belt and the film. In this way, the solar cells can be stably positioned and conveyed without external action during the laying process of the solar cell string.

Technical solutions of the present disclosure are described as follows.

In a first aspect, this application provides a suction unit, comprising:
 a first module;
 a second module; and
 a third module;
 wherein the first module, the second module and the third module are sequentially laminated from top to bottom; the first module is provided with an air-permeable zone; the second module is provided with a first air hole group; the third module is provided with a second air hole group; a solder ribbon and a solar cell are sequentially stacked on the first module; the second module is configured to drive the first module, the solder ribbon and the solar cell to translate relative to the third module, and suck air from a first end of the second air hole group; a second end of the second air hole group is attached to a bottom of the second module; the first air hole group comprises a first air hole and a second air hole; the second air hole group comprises a third air hole and a fourth air hole; the third air hole is communicated with the first air hole to form a first channel; a first negative pressure is created between the a top of the first channel and a bottom of the first module, so as to hold and fix the first module on the second module; the fourth air hole is communicated sequentially with the second air hole and the air-permeable zone to form a second channel; and a second negative pressure is created between a top of the second channel and a bottom surface of the solar cell, so as to hold and fix the solder ribbon and the solar cell on the first module.

In a second aspect, this application provides a transfer mechanism, comprising:
 a driving component;
 a fixed frame; and
 a conveyor belt surrounding an outside of the fixed frame;
 wherein the driving component is configured to drive the conveyor belt to rotate; a solar cell, a solder ribbon and a film are stacked sequentially on the conveyor belt from top to bottom; the film is configured to cover and stick the solder ribbon to the solar cell; an air-permeable zone is provided in a projection area of the solar cell on the film; the conveyor belt is provided with a first air hole running through the conveyor belt; the fixed frame is provided with an air hole group; a first end of the air hole group is attached to a bottom of the conveyor belt, and a second end of the air hole group is connected to an external air source; the air hole group comprises a second air hole and a third air hole; the driving component is configured to drive the conveyor belt to rotate, so as to drive the solar cell, the solder ribbon and the film to move; when the conveyor belt is operated, the second air hole is communicated sequentially with the first air hole and the air-permeable zone to form a first channel, and a first negative pressure is formed between the first channel and a bottom surface of the solar cell, such that the solar cell stacked on the solder ribbon is held and fixed; the conveyor belt is also provided with a fourth air hole; the fourth air hole does not communicate with the air-permeable zone, and is communicated with the third air hole to form a second channel; and a second negative pressure is formed between the second channel and a bottom surface of the film, so as to hold and fix the film.

In some embodiment, the air-permeable zone is a gap segmenting the film into segments or a through hole penetrating the film.

In some embodiment, the first air hole is a ventilation mesh hole or a cutting hole.

In some embodiment, the second air hole and the third air hole each are a through hole.

In some embodiment, an upper surface of the conveyor belt is provided with a plurality of grooves extending along a length direction of the solder ribbon and a plurality of bosses; the plurality of grooves and the plurality of bosses are alternately arranged; each of the plurality of grooves is configured to accommodate the solder ribbon; and the plurality of bosses are configured to support the film.

In some embodiment, at least two of the plurality of bosses are respectively provided with the first air hole and the fourth air hole.

In some embodiment, each of the plurality of grooves is provided with the first air hole and the fourth air hole.

In some embodiment, the number of the solder ribbon is two or more; the number of the plurality of grooves is the same with the number of two or more solder ribbons, and meets requirements of a spacing between the two or more solder ribbons in a solar cell string.

In some embodiment, the transfer mechanism further comprises a front portion, a middle portion, and a rear portion;

wherein the front portion is configured for stacking of the film, the solder ribbon and the solar cell to form a solar cell string; the middle portion is configured to heat the film to bond the film to the solar cell; the rear portion is configured to cool the film to allow firm bonding between the film and the solar cell; and the conveyor belt is configured to transport the solar cell string to pass through the front portion, the middle portion and the rear portion in sequence.

In some embodiments, the fixed frame is provided with a heating mechanism; the heating mechanism is arranged at the middle portion, and is configured to heat and melt the film to enable fixing of the solder ribbon to a surface of the solar cell.

In a third aspect, this application provides a loading device, comprising:
the transfer mechanism provided in the second aspect;
a film-supplying device; and
a film-laying device;
wherein the film-laying device is arranged on a side of the film-supplying device; the transfer mechanism comprises a horizontal bearing surface and a film-laying surface extending downward from the horizontal bearing surface; the film-laying device is configured to continuously lay the film on the film-laying surface; the conveyor belt on the film-laying surface is provided with the first air hole; and at least one film is attached to the film-laying surface.

In some embodiments, an included angle between the film-laying surface and the bearing surface is θ, and 90°≤θ<180°; and the film-laying device is configured to continuously lay the film onto the film-laying surface.

In some embodiments, the film-laying surface comprises a first straight section and a second straight section; the first straight section is connected to the horizontal bearing surface; the second straight section is connected to the first straight section, and is parallel to the horizontal bearing surface; the film-supplying device is located below the second straight section; and the film-laying device is located on a side of the film-supplying device, and is configured to continuously lay the film onto the second straight section.

In a fourth aspect, this application further provides a method for laying out a solar cell string using the aforementioned loading device, wherein the solar cell string further comprising an upper film stacked on an upper solder ribbon above the solar cell and a lower film laid on a lower solder ribbon below the solar cell; and the method comprising:

(S10) laying, by the film-laying device, the lower film on the film-supplying device onto the conveyor belt on the film-laying surface;

(S20) conveying, by the conveyor belt, the lower film from the film-laying surface to a front end of the horizontal bearing surface;

(S30) drawing a solder ribbon having a preset length; and laying a front section of the solder ribbon onto a first solar cell in front of the lower film, and laying a rear section of the solder ribbon onto the lower film;

(S40) placing a second solar cell on the rear section of the solder ribbon; and placing the upper film on the front section of the solder ribbon; and (S50) conveying, by the conveyor belt, a third solar cell forward; and repeating steps (S10)-(S40) for successive laying, so as to form the solar cell string;

wherein steps (S20) and (S30) are performed simultaneously.

Compared to the prior art, the present disclosure has the following beneficial effects.

In this application, when laying the solar cell string, the solar cell and the solder ribbon below the solar cell can be fixed without involving a pressing structure that is configured to apply pressure to the upper surface of the solar cell or fix the solder ribbon in advance. During the transfer of the solar cell string, the solar cell and the solder ribbon below the solar cell are held and fixed on the conveyor belt. In such cases, the positions of the solar cell and the solder ribbon do not shift, ensuring the production quality of the solar cell string.

When bonding the solder ribbon to the solar cell with the film and laying the solar cell string, the films are laid according to the preset spacing on the film-laying surface through the transfer mechanism, and then are continuously transferred to the bearing surface of the transfer mechanism, so as to improve the laying efficiency of the solar cell string.

BRIEF DESCRIPTION OF THE DRAWINGS

To illustrate the technical solutions in the embodiments or prior art of the present disclosure more clearly, the accompanying drawings used herein are described briefly below. Obviously, the accompanying drawings in the following description are only some embodiments of the present disclosure, and other accompanying drawings may be obtained by one of ordinary skill in the art without paying for creative work according to the following figures.

Figure 1:
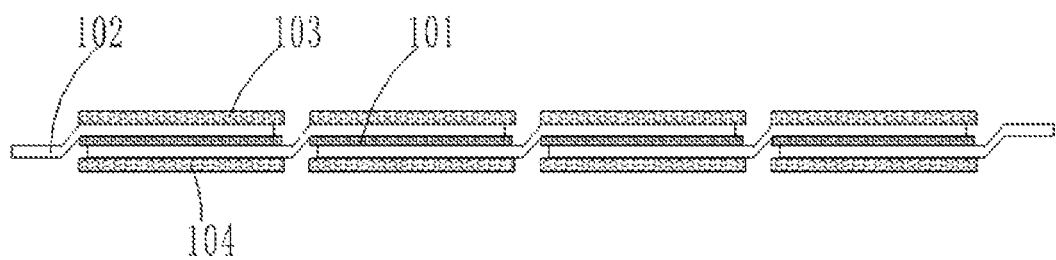
FIG. 1 is a front view of a solar cell string according to an embodiment of the present disclosure.

In the drawings, 101, solar cell; 102, solder ribbon; 103, upper film; 104, lower film; 200, first module; 300, second module; 400, third module; 201, air-permeable zone; 1, conveyor belt; 13, groove; 2, fixed frame; 21, heating mechanism; 3, driving component; 4, film-supplying device; 5, film-laying device; 6, film-laying surface; 61, first straight section; and 62, second straight section.

DETAILED DESCRIPTION OF EMBODIMENTS

The technical solutions in the embodiments of the present disclosure will be clearly and completely described below with reference to the accompanying drawings. Obviously, the described embodiments are only a part of the embodiments of the present disclosure. Based on the described embodiments, any embodiment obtained by one of ordinary skill in the art without paying for creative work shall fall within the scope of protection of the present disclosure.

As used herein, the terms indicating orientations or positions, such as "up", "down", "left", and "right", are based on the orientation or position relationships shown in the accompanying drawings. These terms are merely intended to facilitate description and simplify operation, rather than indicating or implying that the device or element referred to must have a particular orientation, and be constructed and operate in a particular orientation, and thus should not be construed as limitations on the present disclosure. In addition, the terms "first" and "second" used herein are only for descriptive distinction and have no special meaning.

To make the above-mentioned objects, features and advantages of the present disclosure more obvious and understandable, embodiments of the present disclosure will be described in detail below with reference to the accompanying drawings.

FIG. 1 schematically illustrates a solar cell string having a bonding-interconnection structure, in which a solder ribbon 102 is bonded to a solar cell 101 through films, and the metal welding between the solder ribbon 102 and the solar cell 101 is not involved. Thus, the film is located on the outside of the solder ribbon in the solar cell string. When laying the solar cell string, the film located at the bottom of the solar cell string needs to be laid on a conveyor belt 1, and then the solder ribbon 102 is stacked on the film, and the solar cell 101 is stacked on the solder ribbon 102. Therefore, the solar cell 101 is not in direct contact with the conveyor belt 1, and thus cannot be held and positioned directly.

Figure 2:
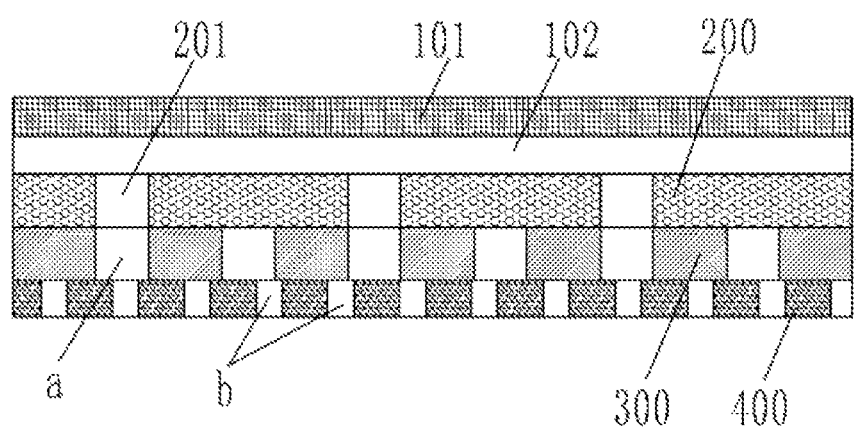
FIG. 2 is a cross-sectional view of a suction unit according to an embodiment of the present disclosure.

Referring to FIG. 2, a suction unit for holding and fixing the solder ribbon 102 and the solar cell 101 is provided, which includes a first module 200, a second module 300, and a third module 400 that are sequentially laminated from top to bottom. An air-permeable zone 201 is provided on the first module 200. The second module 300 is provided with a plurality of air holes a, and the third module 400 is provided with a plurality of air holes b. The solder ribbon 102 and the solar cell 101 are stacked on the first module 200. The solder ribbon 102 is in contact with the first module 200. The solar cell 101 is placed on the solder ribbon 102. The second module 300 is configured to drive the first module 200, the solder ribbon 102 and the solar cell 101 to translate relative to the third module 400 and suck air from a first end of the air hole b. A second end of the air hole b is attached to the bottom of the second module 300. The first module 200, the solder ribbon 102 and the solar cell move with the second module 300.

The plurality of air holes a includes a first air hole and a second air hole, and the plurality of air holes b include a third hole and a fourth hole. The third air hole is communicated with the first air hole to form the channel S2. A negative pressure is created between the channel S2 and the bottom surface of the first module 200, so as to hold and fix the first module 200 on the second module 300. The fourth air hole is communicated sequentially with the second air hole and the air-permeable zone 201 to form the channel S1. A negative pressure is created between the top of the channel S1 and the bottom surface of the solar cell 101, so as to hold and fix the solder ribbon 102 and the solar cell 101 on the first module 200.

Due to the presence of a gap between adjacent solder ribbons 102, the top of the channel S1 faces directly toward the bottom surface of the solar cell 101, and a negative pressure is formed between the channel S1, the solder ribbon 102 and the bottom surface of the solar cell 101, so that the solar cell 101 is held, and the solder ribbon 102 is pressed by the solar cell 101 on the first module 200 under the action of pressure.

Figure 3:
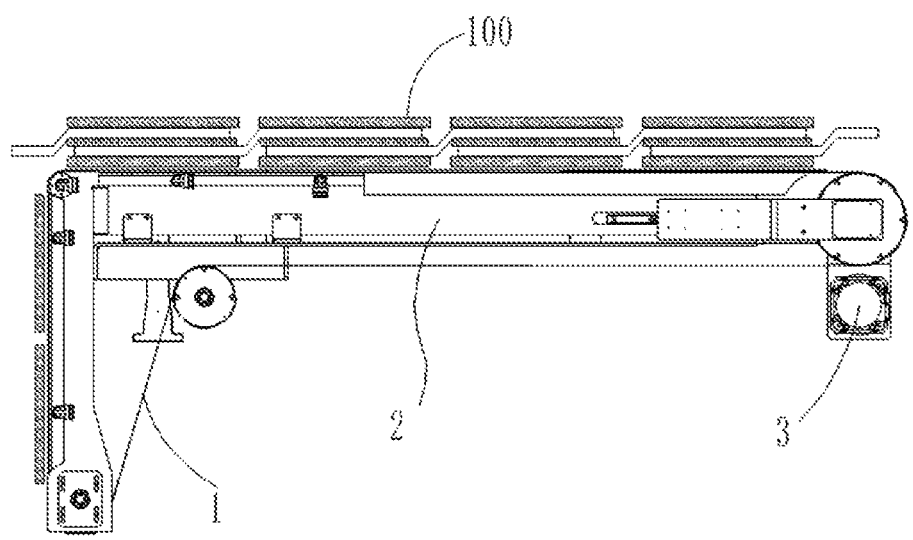
FIG. 3 is a schematic diagram of a transfer mechanism according to an embodiment of the present disclosure.
Figure 4:
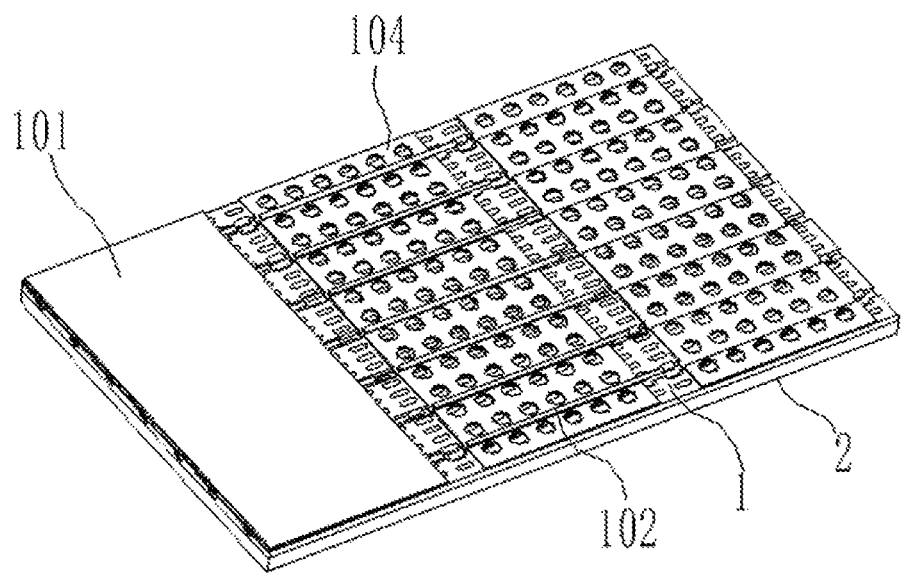
FIG. 4 schematically shows a partial structure of the transfer mechanism in FIG. 3.

This application also provides a transfer mechanism, as shown in FIGS. 3 and 4. The transfer mechanism includes a driving component 3, a fixed frame 2 and a conveyor belt 1 surrounding the outside of the fixed frame 2. The driving component 3 is configured to drive the conveyor belt 1 to rotate around a circumference direction thereof. When laying the solar cell string, at least the solar cell 101, the solder ribbon 102 and the film are stacked sequentially on the conveyor belt 1, where the film is configured to cover and stick the solder ribbon to the solar cell 101. Moreover, the air-permeable zone 201 is provided in a projection area of the solar cell on the film.

Specifically, the conveyor belt 1 is provided with a plurality of air holes a running through the conveyor belt 1. The fixed frame 2 is provided with a plurality of air holes b. A first end of the air hole b is attached to the bottom of the conveyor belt 1, i.e., the contact surface between the fixed frame 2 and the conveyor belt 1. A second end of the air hole b can be provided on any side of the fixed frame 2, and is connected to an external air source. The driving component 3 is configured to drive the conveyor belt 1 to rotate, so as to drive the film, the solder ribbon 102, and the solar cell 101 to move synchronously. The plurality of air holes b includes first air holes and second air holes.

Each first air hole is communicated with the corresponding air hole a and the air-permeable zone 201 to form the channel S1. The external air source is connected with the channel S1, forming a negative pressure between the channel S1, the solder ribbon 102, and the solar cell 101. In this case, the solar cell 101 is held and fixed on the solder ribbon 102, and the solder ribbon 102 is thus pressed by the solar cell onto the first module 200 under the action of pressure, so as to fix the solar cell 101 on the solder ribbon 102.

In addition, the conveyor belt 1 is provided with a plurality of air holes a1 respectively provided on two sides of the air-permeable zone 201. Each second air hole is communicated with the corresponding air hole a1 to form the channel S2. A negative pressure is formed between the channel S2 and the bottom of the film to hold and fix the film.

The film in the solar cell string provided herein covers one or more solar cells.

In some embodiments, the air-permeable zone 201 is a gap segmenting the film into segments or a through hole penetrating the film. In an embodiment, the film is divided into two segments, and the two segments are spaced apart to form the gap. In an embodiment, the film is divided into several segments, and adjacent two segments are spaced apart to form the air-permeable zone 201. The through hole penetrating the film includes the air-permeable zone 201 formed by one or more elongate through holes or circular through holes.

In some embodiments, the air holes a on the conveyor belt 1 are ventilation mesh holes or cutting holes. The ventilation mesh hole is a mesh-shaped hole with a small spacing, or provided by the material having high permeability, such as a Teflon mesh belt, a cloth belt, and a polytetrafluoroethylene (PTFE) high-temperature cloth belt. The cutting holes are punched after the belt is formed, and are regularly distributed on the surface of the conveyor belt 1, The air hole a can be adjusted arbitrarily regarding size, shape and spacing, as long as it can be communicated with the air hole b on the fixed frame and the air-permeable zone 201 on the bottom film of the solar cell string to form the channel S1, and the channel S1 can be used to adsorb the bottom of the solar cell 101. Thus, these parameters are not specifically limited in this application.

Specifically, the air hole b on the fixed frame 2 is open at both ends, and can be an air hole, an air chamber, or an air channel. Accordingly, one end of the air chamber is connected to a blower or fan to suck air from the air chamber, and the other end of the air chamber is in contact with the bottom surface of the conveyor belt 1 to suck air from the air holes a and the air holes al on the conveyor belt 1. One end of the air channel is connected to an air source box or fan to suck air from the air channel, and the other end of the air channel is in contact with the bottom surface of the conveyor belt 1 to suck air from the air holes a and the air holes al on the conveyor belt 1, so as to hold the film or the solar cell 101 through the air-permeable zone on the film.

At an initial stage, the film, the solder ribbon 102 and the solar cell 101 are unbonded together, but merely being stacked on the conveyor belt 1 according to the laying rule of the solar cell string. The conveyor belt 1 is driven by the driving component 3 to rotate. Then the film, the solder ribbon 102 and the solar cell 1-1 move synchronously with the conveyor belt 1. During the movement, the solar cell 101 is held and fixed through the channel S1 formed by the air holes b on the fixed frame, the air holes a on the conveyor belt 1, and the air-permeable zone on the film, so that the solder ribbon 102 is pressed by the solar cell 101 and is thus positioned and fixed. After the solar cell 101 is laid, during the backward moving of the conveyor belt 1, the external air source connected to the second end of the air hole b continuously acts on the air hole a on the conveyor belt 1. In this way, the solar cell 101 can be kept above the solder ribbon 102, and the solder ribbon 102 is fixed between the solar cell 101 and the film, thus simplifying the transfer structure for laying the solar cell string and achieving the synchronous positioning of the solar cell 101 and the solder ribbon 102 without adding other positioning structures.

In an embodiment, the driving component 3 drives the conveyor belt 1 to rotate, and the conveyor belt 1 drives the film, the solder ribbon 102 and the solar cell 101 to move synchronously. During this process, the film is attached to the surface of the conveyor belt 1 through the channel S2 formed by the air holes b on the fixed frame 2 and the air holes a on the conveyor belt 1. Specifically, during the synchronous movement of the film, the solder ribbon 102 and the solar cell 101, there is always an air hole b in communication with an air hole a and the air-permeable zone 201 to form the channel S1 for holding and fixing the solar cell 101, and there is also always an air hole b in communication with an air hole al on the conveyor belt 1, and not in communication with the air-permeable zone 201 on the film to form the channel S2 for holding and fixing the film.

Figure 5:
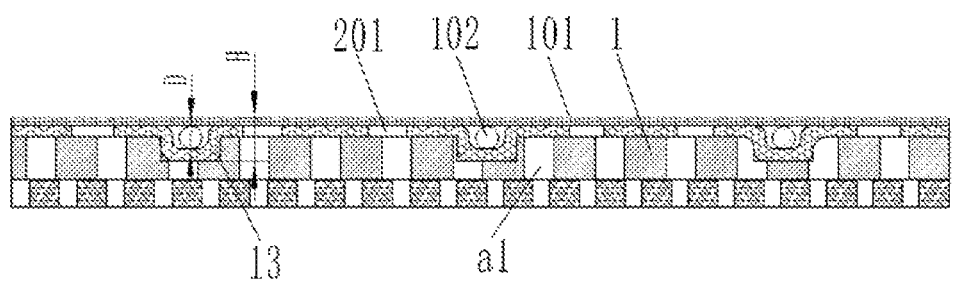
FIG. 5 is a cross-sectional view of a suction unit according to an embodiment of the present disclosure.

In some embodiments, as shown in FIG. 5, the upper surface of the conveyor belt 1 is provided with grooves 13 extending along a length direction of the solder ribbon 102 and bosses, where the grooves 13 and the bosses are alternately arranged. The grooves 13 are each configured to accommodate the solder ribbon 102 at the bottom of the solar cell 101, and the bosses are configured to support the film. The number of grooves 13 is the same with the number of solder ribbons 102, and the grooves 13 are in one-to-one correspondence to the solder ribbons 12. Preferably, the depth H of the groove 13 is greater than or equal to the diameter D of the solder ribbon 102, namely, H ≥D, i.e., the top surface of the solder ribbon 102 is not higher than the upper surface of the film placed on the boss, so that the film and the solar cell 101 are stacked on the boss in sequence, and the upper surface of the film can directly contact the solar cell 101. The channel S1 directly acts on the lower surface of the solar cell 101, such that the lower surface of the solar cell 101 is adsorbed to closely attach to the film on the boss, thereby achieving the suction and position of the solar cell 101.

In some embodiments, at least two of the bosses are respectively provided with the air holes a and the air hole al, where the air hole a is communicated with the air hole b on the fixed frame 2 to form the channel S2 for holding the film on the conveyor belt 1, and the air hole al is communicated with the air hole b on the fixed frame and the air-permeable zone 201 on the film to form the channel S1 for holding and fixing the solar cell 101 on the solder ribbon 102.

In some embodiments, each of the grooves 13 is provided with the air hole a and the air hole al, where the air holes a and the air holes al are alternately arranged. The air holes corresponding to the bottom of the film are the air holes al, and those corresponding to the air-permeable zone 201 on the film are the air holes a. The air source in the air holes a passes through the air-permeable zone 201 and acts on the bottom surface of the solar cell 101 to hold and fix the solar cell 101.

In an embodiment, the transfer mechanism includes a front portion, a middle portion and a rear portion. The front portion is configured for stacking of the film, the solder ribbon 102 and the solar cell 101 to form the solar cell string. The middle portion is configured to heat the film to allow firm bonding between the film and the solar cell 101, and allow the solder ribbon to locate between the film and the solar cell 101. The rear portion is configured for cooling to allow for firm bonding between the film and the solar cell. The solar cell string is transported by the conveyor belt to pass through the front portion, the middle portion and the rear portion in sequence. When preparing the solar cell string, the film, the solder ribbon 102 and the solar cell 101 are stacked in accordance with the laying rule of the solar cell string at the front portion and then continue to convey to the middle portion to heat the solar cell string, so that the film on the boss is bonded to the bottom surface of the solar cell. Afterwards, the conveyor belt 1 continues to convey backwards, and the solar cell string leaves the middle portion and enters the rear portion. The solar cell string is partially in contact with air to cool the film and the solar cell 101 such that the film is cured and firmly boned to the solar cell 101. In this way, the solder ribbon 102 is fixed between the film and the solar cell 101 to finally form the solar cell string. During the manufacture and transfer of the solar cell string, the two sides of the solder ribbon are limited by the groove 13 on the conveyor belt 1. A negative pressure is formed between the bottom surface of the solar cell 101 and the channel S1, which absorbs the solar cell 101, so as to fix the solar cell on the solder ribbon 102. In this way, the solder ribbon 102 is limited relative to the conveyor belt 1 by the pressure from the solar cell 101, thus ensuring the positioning accuracy of the solder ribbon 102.

When the solar cell string is prepared continuously, one end of the solar cell string is successively transferred into the front portion, the middle portion and the rear portion. The middle portion is provided with a heating mechanism 21. The heating mechanism 21 is configured to transfer heat to the film and the solar cell 101 on the conveyor belt 1, so as to heat and melt the film on the conveyor belt to enable fixing of the solar cell 101 to the surface of the solar cell 101, When one end of the solar cell string enters the middle portion, the solar cell string is heated, and at the same time, the film, the solder ribbon 102 and the solar cell 101 continue to be stacked at the other end of the solar cell string at the front portion. When one end of the solar cell string enters the rear portion for cooling, the next solar cell string is heated by the middle portion. At the same time, the film, the solder ribbon 102 and the solar cell 101 continue to be stacked at the rear end of the next solar cell string at the front portion, which can enhance the production efficiency for the solar cell string.

Figure 6:
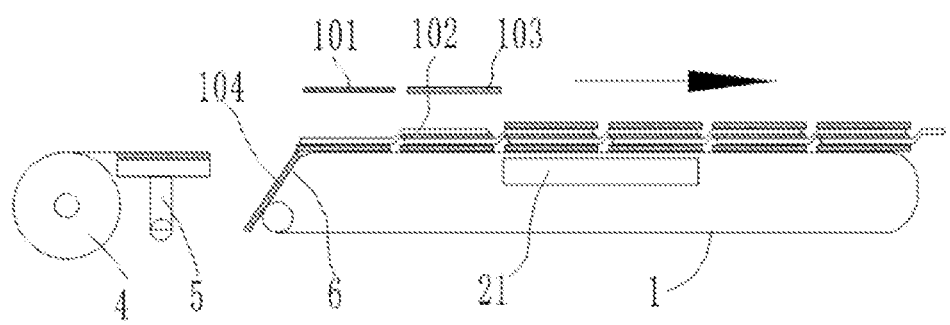
FIG. 6 is a schematic diagram of a loading device according to an embodiment of the present disclosure.
Figure 7:
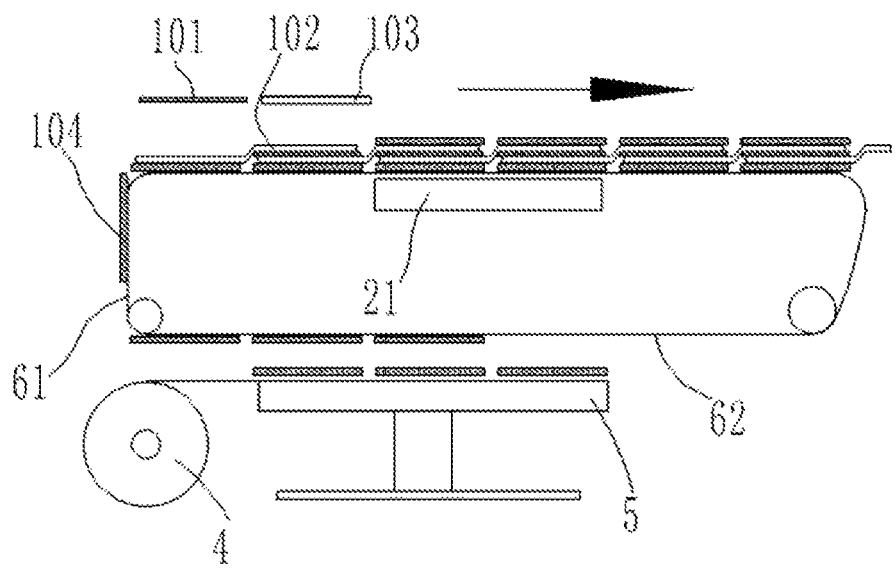
FIG. 7 is a schematic diagram of a loading device according to an embodiment of the present disclosure.

Referring to FIGS. 6 and 7, the present application also provides a loading device, which includes any one of the above-mentioned transfer mechanisms. The loading device further includes a film-supplying device 4 and a film-laying device 5. The film-laying device 5 is arranged on a side of the film-supplying device 4. In this embodiment, the transfer mechanism includes a horizontal bearing surface and a film-laying surface 6 extending downward from the bearing surface. The film-laying surface 6 is provided with the channel S1. At least one film is attached to the film-laying surface 6. The films on the film-laying surface 6 are in one-to-one correspondence to the solar cells 101.

In an embodiment, as shown in FIG. 6, there is an included angle θ between the film-laying surface 6 and the bearing surface, and 90°≤θ<180°. The film-supplying device 4 is arranged at an end of the front portion. The film-laying device 5 is located between the film-supplying device 4 and the transfer mechanism, and is configured to continuously lay the film onto the film-laying surface 6. The conveyor belt 1 is configured to transfer the film on the film-laying surface 6 to the front section of the bearing surface for laying the solar cell string. The film-laying device includes a support plate for holding the lower film 104 and a drive arm rotatably connected to the support plate. The support plate is provided with suction cups for adsorbing the lower film 104. When θ=90°, the film-laying device 5 is configured to adsorb and fix the backing film 104 supplied by the film-supply device 4 on the support plate, and then the drive arm rotates for 90° to attach the upper surface of the lower film 104 to the film-laying surface 6. The angle between the support plate and the drive arm rotates with the contact angle between the support plate and the film-laying surface 6, so that the upper surface of the lower film 104 is evenly attached to the conveyor belt 1 on the film-laying surface 6. Similarly, when θ=120°, the drive arm only needs to rotate 60° to attach the lower film 104 to the conveyor belt 1 on the film-laying surface 6.

In an embodiment, as shown in FIG. 7, the film-laying surface 6 includes a first straight section 61 and a second straight section 62. The first straight section 61 is connected to the bearing surface, and the second straight section 62 is connected to the first straight section 61 and is parallel to the bearing surface. Both the first straight section 61 and the second straight section 62 are provided with the channel S2. In this embodiment, the film-supplying device is located below the second straight section 62. The film-laying device 5 is located on a side of the film-supplying device 4 and is configured to continuously lay the film onto the second straight section 62. The film-supplying device 4 is configured to prepare films on the film-laying device 5. The film-laying device 5 further includes a support plate and a lifting mechanism. The support plate is provided with suction cups for adsorbing the lower film. The prepared films are placed on the upper surface of the support plate. The lifting mechanism is configured to drive the support plate to move up and down, and push the film on the support plate upwards to contact with the lower surface of the conveyor belt 1. After the film is absorbed by the air holes a on the conveyor belt 1, the support plate releases the film and moves downwards. The conveyor belt 1 transfers the film on the second straight section 62 to the first straight section 61 and the front part of the bearing surface in turn. During this process, the film is always attached to the surface of the conveyor belt 1.

Based on the above-mentioned loading device, the present application also provides a method for laying a solar cell string using the loading device described in any one of the above-mentioned embodiments. The solar cell string further includes an upper film 103 stacked on an upper solder ribbon 102 above the solar cell 101 and a lower film 104 laid on a lower solder ribbon 102 below the solar cell 101. To clearly explain the technical solutions of the present application, in the solar cell string, each solder ribbon 102 extends to an upper surface of one of adjacent two solar cells 101 and a lower surface of the other of the adjacent two solar cells 101. The upper solder ribbon 102 and the lower solder ribbon 102 are bonded to the solar cell 101 through the film. For the purpose of differentiation, the film attached to a side of the solar cell string is close to the conveyor belt 1 is referred to as a lower film 104, and the film attached to the upper side of the solar cell string is referred to as an upper film 103. The laying of the solar cell string is performed through the following steps.

(S10) The lower film 104 on the film-supplying device 4 is laid onto the conveyor belt 1 on the film-laying surface by the film-laying device 5.

(S20) The lower film 104 is conveyed from the film-laying surface to the front end of the bearing surface by the conveyor belt 1.

(S30) The solder ribbon 102 having a fixed length is laid. The front section of the solder ribbon 102 is laid onto a first solar cell in front of the lower film, and the rear section of the solder ribbon 102 is laid onto the lower film.

(S40) A second solar cell is placed on the rear section of the solder ribbon 102, and the upper film is placed on the front section of the solder ribbon 102.

(S50) The conveyor belt 1 continues to convey a third solar cell forward, and steps (S10)-(S40) are repeated for successive laying to form the solar cell string.

In this regard, steps (S20) and (S30) can be performed simultaneously, and the two steps do not affect each other. Therefore, the laying efficiency of the solar cell string can be improved, thereby improving the production efficiency of the solar cell string.

Specifically, the film-laying device is configured to attach the lower film 104 to the film-laying surface 6 of the transfer mechanism. The lower film 104 is then transferred to the front section of the bearing surface by the conveyor belt 1. Afterwards, the solder ribbon 102 is laid onto the lower film 104. The front section of the solder ribbon 102 is laid onto the solar cell front of the lower film 104, and the rear section of the solder ribbon 102 is laid onto the lower film 104 at the front portion. In this embodiment, the front direction refers to the transfer direction of the solar cell string, and the opposite is the back direction. Afterwards, the solar cell 101 and the upper film 103 are stacked on the solder ribbon, so that upper film 103 is placed on the front section of the solder ribbon 102 to be in contact with the upper surface of the solar cell 101, and the solar cell 101 is placed on the rear section of the solder ribbon 102. After the laying of each solar cell is completed, the conveyor belt 1 transfers forward a distance for a solar cell 101. The lower film 104 on the film-laying surface is transferred to the bearing surface. Then a first section of the solder ribbon 102 is placed on the solar cell 101, and a second section of the solder ribbon 102 is placed on the lower film 104, and the upper film 103 is stacked on the first section of the solder ribbon, and the next solar cell 101 is stacked on the second section of the solder ribbon 102, and so on, to complete the continuous laying and transportation of the desired solar cell string.

It is clear for those skilled in the art that the present disclosure is not limited to the details described in the above exemplary embodiments, and can be implemented in other forms without departing from the spirit or essential features of the present disclosure. Therefore, the described embodiments should be regarded as exemplary and non-limiting. The scope of the present disclosure is defined by the appended claims, rather than the above description. Thus, all variations falling within the meaning and scope of the equivalent elements of the claims shall be encompassed in the present disclosure.

Specific examples are described herein to illustrate the principles and implementation of the present disclosure, and the above embodiments are only intended to facilitate the understanding of the method and the core idea of the present disclosure. At the same time, it should be understood that any changes, modifications and replacements made by those skilled in the art without departing from the spirit of the disclosure should fall within the scope of the disclosure defined by the appended claims.

What is claimed is:

1. A transfer mechanism, comprising:
    a driving component;
    a fixed frame; and
    a conveyor belt surrounding an outside of the fixed frame;
    wherein the driving component is configured to drive the conveyor belt to rotate; a solar cell, a solder ribbon and a film are stacked sequentially on the conveyor belt from top to bottom; the film is configured to cover and stick the solder ribbon to the solar cell; an air-permeable zone is provided in a projection area of the solar cell on the film; the conveyor belt is provided with a first air hole running through the conveyor belt; the fixed frame is provided with an air hole group; a first end of the air hole group is attached to a bottom of the conveyor belt, and a second end of the air hole group is connected to an external air source; the air hole group comprises a second air hole and a third air hole; the driving component is configured to drive the conveyor belt to rotate, so as to drive the solar cell, the solder ribbon and the film to move; when the conveyor belt is operated, the second air hole is communicated sequentially with the first air hole and the air-permeable zone to form a first channel, and a first negative pressure is formed between the first channel and a bottom surface of the solar cell, such that the solar cell stacked on the solder ribbon is held and fixed; the conveyor belt is also provided with a fourth air hole; the fourth air hole does not communicate with the air-permeable zone, and is communicated with the third air hole to form a second channel; and a second negative pressure is formed between the second channel and a bottom surface of the film, so as to hold and fix the film.

2. The transfer mechanism of claim 1, wherein the air-permeable zone is a gap segmenting the film into segments or a through hole penetrating the film.

3. The transfer mechanism of claim 1, wherein the first air hole is a ventilation mesh hole or a cutting hole.

4. The transfer mechanism of claim 1, wherein the second air hole and the third air hole each are a through hole.

5. The transfer mechanism of claim 1, wherein an upper surface of the conveyor belt is provided with a plurality of grooves extending along a length direction of the solder ribbon and a plurality of bosses; the plurality of grooves and the plurality of bosses are alternately arranged; each of the plurality of grooves is configured to accommodate the solder ribbon; and the plurality of bosses are configured to support the film.

6. The transfer mechanism of claim 5, wherein at least two of the plurality of bosses are respectively provided with the first air hole and the fourth air hole.

7. The transfer mechanism of claim 5, wherein each of the plurality of grooves is provided with the first air hole and the fourth air hole.

8. The transfer mechanism of claim 5, wherein the number of the solder ribbon is two or more; the number of the plurality of grooves is the same with the number of two or more solder ribbons, and the plurality of grooves are in one-to-one correspondence to the two or more solder ribbons.

9. The transfer mechanism of claim 1, further comprising:
    a front portion;
    a middle portion; and
    a rear portion;
    wherein the front portion is configured for stacking of the film, the solder ribbon and the solar cell to form a solar cell string; the middle portion is configured to heat the film to bond the film to the solar cell; the rear portion is configured to cool the film to allow firm bonding between the film and the solar cell; and the conveyor belt is configured to transport the solar cell string to pass through the front portion, the middle portion and the rear portion in sequence.

10. The transfer mechanism of claim 9, wherein the fixed frame is provided with a heating mechanism; the heating mechanism is arranged at the middle portion, and is configured to heat and melt the film to enable fixing of the solder ribbon to a surface of the solar cell.

11. A loading device, comprising:
    the transfer mechanism of claim 1;
    a film-supplying device; and
    a film-laying device;
    wherein the film-laying device is arranged on a side of the film-supplying device; the transfer mechanism comprises a horizontal bearing surface and a film-laying surface extending downward from the horizontal bearing surface; the film-laying device is configured to continuously lay the film on the film-laying surface; the conveyor belt on the film-laying surface is provided with the first air hole; and at least one of the film is attached to the film-laying surface.

12. The loading device of claim 11, wherein the film-laying surface comprises a first straight section and a second straight section; the first straight section is connected to the horizontal bearing surface; the second straight section is connected to the first straight section, and is parallel to the horizontal bearing surface; the film-supplying device is located below the second straight section; and the film-laying device is configured to continuously lay the film onto the second straight section.

13. A method for laying a solar cell string using the loading device of claim 12, the solar cell string further comprising an upper film stacked on an upper solder ribbon above the solar cell and a lower film laid on a lower solder ribbon below the solar cell; and the method comprising:

(S10) laying, by the film-laying device, the lower film on the film-supplying device onto the conveyor belt on the film-laying surface;
(S20) conveying, by the conveyor belt, the lower film from the film-laying surface to a front end of the horizontal bearing surface;
(S30) drawing a solder ribbon having a preset length; and laying a front section of the solder ribbon onto a first solar cell in front of the lower film, and laying a rear section of the solder ribbon onto the lower film;
(S40) placing a second solar cell on the rear section of the solder ribbon; and
placing the upper film on the front section of the solder ribbon; and
(S50) conveying, by the conveyor belt, a third solar cell forward; and repeating steps (S10)-(S40) for successive laying, so as to form the solar cell string;
wherein steps (S20) and (S30) are performed simultaneously.

* * * * *